United States Patent
Mudd et al.

(10) Patent No.: US 7,437,133 B2
(45) Date of Patent: Oct. 14, 2008

(54) RADIO FREQUENCY TUNER FRONT END AND TUNER

(75) Inventors: Mark Stephen John Mudd, Swindon (GB); Nicholas Paul Cowley, Wroughton (GB)

(73) Assignee: Intel Corporation, Santa Clara, CA (US)

( * ) Notice: Subject to any disclaimer, the term of this patent is extended or adjusted under 35 U.S.C. 154(b) by 800 days.

(21) Appl. No.: 10/247,952

(22) Filed: Sep. 20, 2002

(65) Prior Publication Data
US 2003/0078018 A1  Apr. 24, 2003

(30) Foreign Application Priority Data
Sep. 25, 2001  (GB)  .................................. 0122983.0

(51) Int. Cl.
*H04B 1/18* (2006.01)

(52) U.S. Cl. ................. 455/180.3; 455/190.1; 455/316; 455/250.1; 375/345

(58) Field of Classification Search .............. 455/173.1, 455/180.1–180.3, 150.1, 182.3, 313–316, 455/188.1–190.1, 232.1, 240.1, 250.1, 339–341; 375/345
See application file for complete search history.

(56) References Cited

U.S. PATENT DOCUMENTS

| | | | | |
|---|---|---|---|---|
| 4,214,212 A | * | 7/1980 | Dipietromaria | .......... 455/190.1 |
| 4,340,975 A | * | 7/1982 | Onishi et al. | ................. 455/315 |
| 4,726,072 A | * | 2/1988 | Yamashita et al. | ........ 455/189.1 |
| 4,866,395 A | * | 9/1989 | Hostetter | ..................... 329/309 |
| 5,027,430 A | * | 6/1991 | Yamauchi et al. | ......... 455/188.1 |
| 5,054,114 A | * | 10/1991 | Erickson | ....................... 455/78 |
| 5,493,717 A | | 2/1996 | Schwarz | |
| 5,867,771 A | * | 2/1999 | Ruitenburg | ................... 455/86 |
| 5,901,340 A | * | 5/1999 | Flickinger et al. | ........... 725/149 |
| 5,930,696 A | | 7/1999 | Tzuang et al. | |
| 6,349,277 B1 | * | 2/2002 | Kamai et al. | ................. 704/207 |
| 6,535,748 B1 | * | 3/2003 | Vuorio et al. | ............. 455/552.1 |
| 6,567,654 B1 | * | 5/2003 | Coronel Arredondo et al. | .......................... 455/315 |
| 7,159,236 B2 | * | 1/2007 | Abe et al. | ..................... 725/111 |
| 2002/0015454 A1 | * | 2/2002 | Charkani | ..................... 375/316 |
| 2002/0079979 A1 | * | 6/2002 | Richardson | ............. 331/117 R |
| 2002/0193067 A1 | * | 12/2002 | Cowley et al. | ............. 455/3.02 |
| 2003/0027537 A1 | * | 2/2003 | Kimura | .................... 455/232.1 |

FOREIGN PATENT DOCUMENTS

| | | |
|---|---|---|
| EP | 0784381 | 7/1997 |
| EP | 1073199 | 1/2001 |
| GB | 2117588 | 10/1983 |

* cited by examiner

*Primary Examiner*—Edward Urban
*Assistant Examiner*—Nhan T. Le
(74) *Attorney, Agent, or Firm*—Erik R. Nordstrom

(57) ABSTRACT

A front end for a radio frequency tuner, for example for connection to a cable distribution network, including an input connected to a signal path comprising an LNA connected via an AGC stage to a signal splitter. The input path has a bandwidth sufficiently wide to pass all of the channels in an input signal and has a substantially constant voltage standing wave ratio over the bandwidth. The splitter supplies identical signals to several filtering paths, each of which comprises a fixed filter. The paths are selectable one at a time and the filters divide the input frequency band into a plurality of contiguous or slightly overlapping sub-bands. The output of the front end is supplied to, for example, a double conversion arrangement comprising an upconverter and a downconverter with first and second IF filters.

24 Claims, 3 Drawing Sheets

RADIO FREQUENCY TUNER FRONT END AND TUNER

The present invention relates to a radio frequency tuner front end and to a tuner incorporating such a front end. Such a tuner may, for example, be of the type referred to as a "cable set top box" used in reception equipment for receiving broadband signals comprising a large number of channels from a cable distribution network.

BACKGROUND

FIG. 1 of the accompanying drawings illustrates a typical known type of cable tuner of the double conversion type. The tuner has an antennae input connected to the input of an automatic gain control (AGC) stage 1 for controlling the signal level supplied to a first frequency changer 2 so as to maximise the signal to intermodulation plus noise performance of the tuner. The AGC stage 1 typically comprises a PIN diode whose input resistance can be varied by varying a standing current therethrough. The resulting variable resistance is used as part of a potential divider for attenuating the input signal in accordance with a gain control signal, which may be derived from a measurement of the signal level downstream of the stage 1 or from a demodulator (not shown).

The first frequency changer 2 comprises a mixer 2a which receives a local oscillator signal from a local oscillator (LO) 2b controlled by a phase locked loop (PLL) synthesiser 3. The first frequency changer 2 performs block up-conversion of all of the channels supplied to the tuner input, for example with the frequency of the desired channel being centred on the first high intermediate frequency, typically 1.1 GHz.

The output of the first frequency changer 2 is supplied to a first intermediate frequency filter 4, which has a defined centre frequency and passband characteristic. Typically, the filter 4 is a bandpass filter whose centre frequency is nominally equal to the first intermediate frequency and whose passband is such that the filter passes a small number of individual channels.

The output of the filter 4 is supplied to a second frequency changer 5, which similarly comprises a mixer 5a and a local oscillator 5b controlled by a phase locked loop synthesiser 6. The second frequency changer 5 performs a block down conversion such that the desired channel is centred on the second intermediate frequency, for example 36 MHz. The output of the second frequency changer 5 is supplied to a second intermediate frequency filter 7, which has a passband substantially equal to a single channel bandwidth and, for example, a shaped passband characteristic as defined by the modulation standard of the received signal. The filter 7 passes the desired channel and substantially eliminates all other channels. The filtered signal is supplied to an amplifier 8 and to the "IF output" of the tuner, which is connected to a suitable demodulator (not shown) which may be of analog or digital type.

The tuner shown in FIG. 1 may be connected to a cable distribution network for receiving television signals, data signals, telephony signals, or combinations thereof. The tuner thus functions as a "port" to the distribution network and is required to meet minimum requirements so as to prevent or reduce interference or similar effects to other users connected to the network while generating an acceptable level of distortion for the received signal. For example, the input of the tuner is required to have a defined input impedance with a minimum return loss so that energy reflected back into the distribution network is at an acceptably low level. Also, the tuner is required to inject an acceptably low level of potentially interfering signals back into the distribution network. Such signals generated within the tuner and potentially injected into the distribution network include local oscillator re-radiation, local oscillator/local oscillator beats, and spurious products generated by the received signals beating with each other or with the local oscillators.

The tuner is required to generate an acceptably low level of distortion for the received signal so that this can be demodulated to provide acceptable reception for a user. There are various mechanisms within the tuner which degrade the received signal. A first of these is caused by thermal noise which results in a broadband noise spectrum across the received channel. A second of these results from intermodulation caused by beating together of received channels. The input signal is generally of a broadband type comprising a large number of channels and this potentially gives rise to a large number of intermodulation products.

These requirements mean that the part of the tuner near its input in the signal path has to minimise noise and intermodulation generation while presenting a well-controlled characteristic input impedance to the distribution network. In particular, this part of the tuner has to provide a low noise figure (NF), high second and third intermodulation intercepts (IIP2, IIP3), and a relatively frequency-independent input impedance which is generally 75 ohms. Also, the amplitude of signals from the distribution network can vary typically from −5 to +15 dBmV so that this part of the tuner must provide acceptable performance over such a dynamic range of input signal levels. This results in an additional requirement of achieving high intermodulation intercept performance at relatively high input signals, which may be expressed in parametric terms as a relatively high "1 dB compression (P1 dB)".

These performance requirements are, at least to some extent, mutually exclusive, in particular where the first active stage of the tuner is a mixer as in the tuner of FIG. 1. For example, the mixing function degrades the noise figure by a minimum of 4 dB and the action of the mixer may introduce phasing imbalances in the signal which can result in degraded intermodulation performance.

GB 2 117 588 discloses a dual standard (VHF/UHF) receiver of the double conversion type. Between the signal first mixer and individual inputs for different bands or types of signals, there are three filtering paths, each containing a filter which is tunable so as to perform some pre-selection of the channel selected for reception. Although there are fixed filters in the form of an IF trap in one filter path and a high pass filter in the lower filter path, these do not function in any way to divide the input bandwidth into a plurality of fixed sub-bands.

EP 0 784 381 discloses what appears to be a radio frequency pager which can be switched to operate at two or more fixed frequencies. Although there are two filter paths alternately switchable into circuit between the common input and the common first mixer, each filter path comprises a bandpass filter whose purpose is to select what is effectively a single channel.

U.S. Pat. No. 5,493,717 discloses an FM car radio having an essentially conventional front end. Following the frequency changer, the IF path contains a switched filtering arrangement in which filters having different bandwidths are switched into the IF path according to "signal evaluation circuits" which respond to the level of the IF signal after the first fixed IF filter. The bandwidths of the filters are for selecting a single channel following conversion to IF with different selectivities according to interference conditions.

SUMMARY

According to a first aspect of the invention, there is provided a radio frequency tuner front end, comprising: an input for receiving an input signal in an input band containing a plurality of channels; a plurality of filtering paths arranged to receive the input signal and having fixed frequency responses a signal path between the input and the filtering paths having a bandwidth sufficiently wide to pass the input band; and a selecting arrangement for enabling any one of the filtering paths at a time to supply a filtered signal, characterised in that the filtering paths are arranged to divide the input band into a plurality of sub-bands, each of which contains a plurality of the channels, and the signal path between the input and the filtering paths has a substantially constant voltage standing wave ration over the bandwidth.

The ratio of the upper frequency limit to the lower frequency limit of the sub-bands may be substantially equal to each other. The ratios may be substantially equal to two.

The sub-bands of the or each adjacent pair may be contiguous or may overlap.

There may be two filtering paths.

Each of the filtering paths may have a bandpass filtering response.

As an alternative, where there are two filtering paths, a lower one may have a low pass filtering response and an upper one may have a high pass filtering response.

As a further alternative, a first of the filtering paths fir a lowest of the sub-bands may have a low pass filtering response, a second of the filtering paths for a highest of the sub-bands may have a high pass filtering response, and the or each other filtering path may have a bandpass filtering response.

The signal path may comprise a buffer stage. The buffer stage may comprise a low noise amplifier. The signal path may comprise an automatic gain control arrangement between the buffer stage and the filtering paths.

The front end may comprise a respective automatic gain control arrangement in each of the filtering paths.

The signal path may comprise a signal splitter having outputs for driving the filtering paths. The selecting arrangement may be arranged to enable any one of the signal splitter outputs at a time.

The front end may comprise a single monolithic integrated circuit.

According to a second aspect of the invention, there is provided a tuner comprising a front end according to the first aspect of the invention and a first frequency changer.

The selecting arrangement may comprise individually enablable input stages of the first frequency changer having inputs connected to outputs of the filtering paths.

The tuner may comprise a first intermediate frequency filter connected to an output of the first frequency changer.

The first frequency changer may be an up-converter.

The tuner may comprise a second frequency changer. The second frequency changer may be a downconverter. The tuner may comprise a second intermediate frequency filter connected to an output of the second frequency changer.

The tuner may comprise a single monolithic integrated circuit.

The tuner may comprise a cable tuner.

It is thus possible to provide a tuner front end and a tuner of improved performance. By dividing the input band into smaller sub-bands, it is possible to improve the intermodulation performance. In particular, the number of channels which may take place in the intermodulation process is reduced so that fewer spurious intermodulation products can be formed.

By using a buffer stage such as a low noise amplifier connected to the input, the reverse isolation properties of the buffer reduce the level of signals generated within the front end or the tuner and injected into a cable distribution network. Also, a better impedance match to the network can be provided so as to reduce reflections of energy back into the network. In particular, input impedance variations resulting from the automatic gain control stage can be substantially reduced or eliminated.

Active splitting of the input signal for driving the filtering paths provides good isolation between such paths and thus limits the total signal bandwidth presented to, for example, a first frequency changer.

It is thus possible simultaneously to achieve a good noise figure, good intermodulation intercepts, a good voltage standing wave ratio (VSWR) and a good P1 dB performance.

BRIEF DESCRIPTION OF THE DRAWINGS

The invention will be further described, by way of example, with reference to the accompanying drawings, in which.

Like reference numerals refer to like parts throughout the drawings.

DETAILED DESCRIPTION

Figure 1:
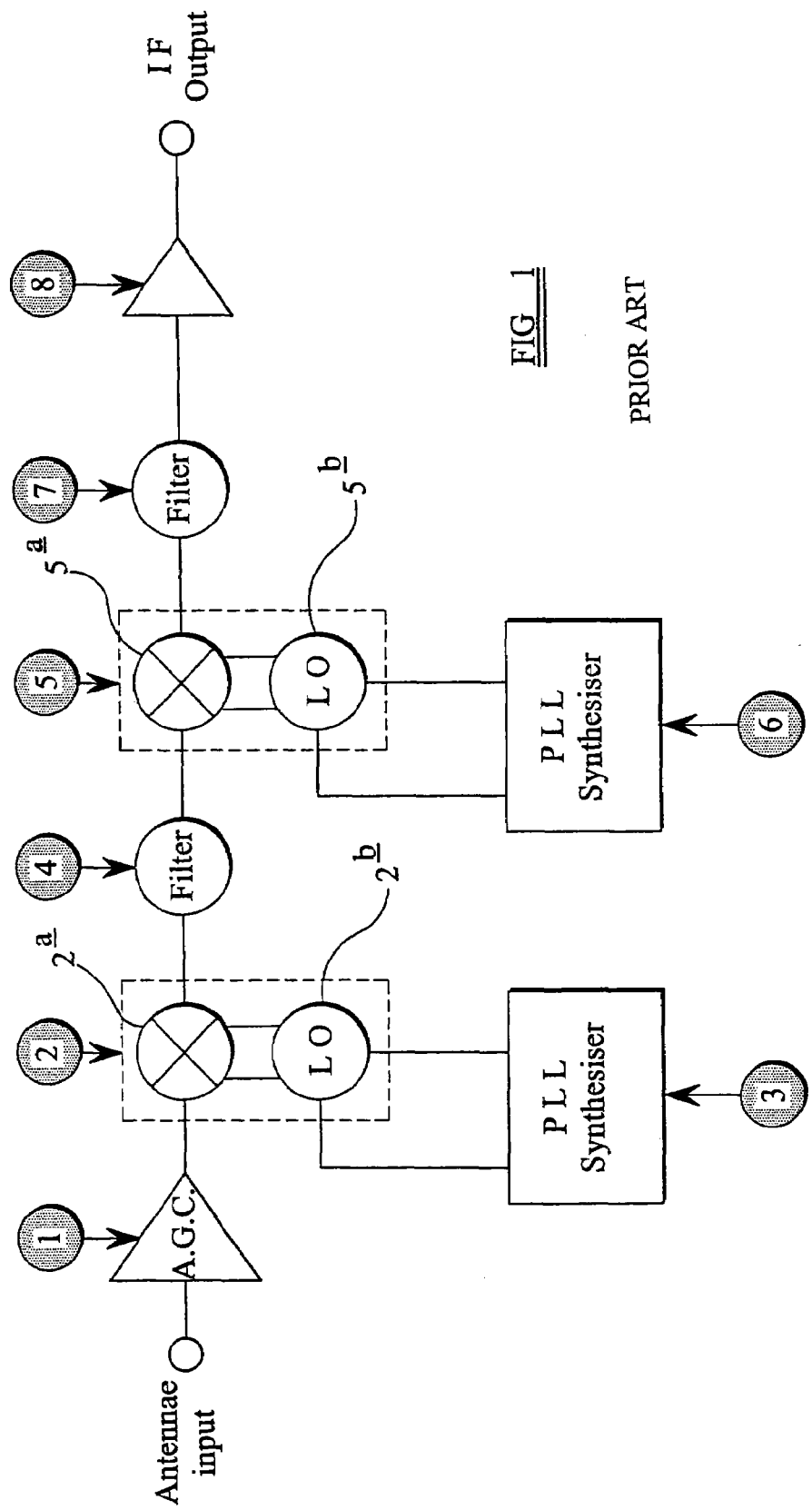
FIG. 1 is a block circuit diagram of a known type of double conversion cable tuner.
Figure 2:
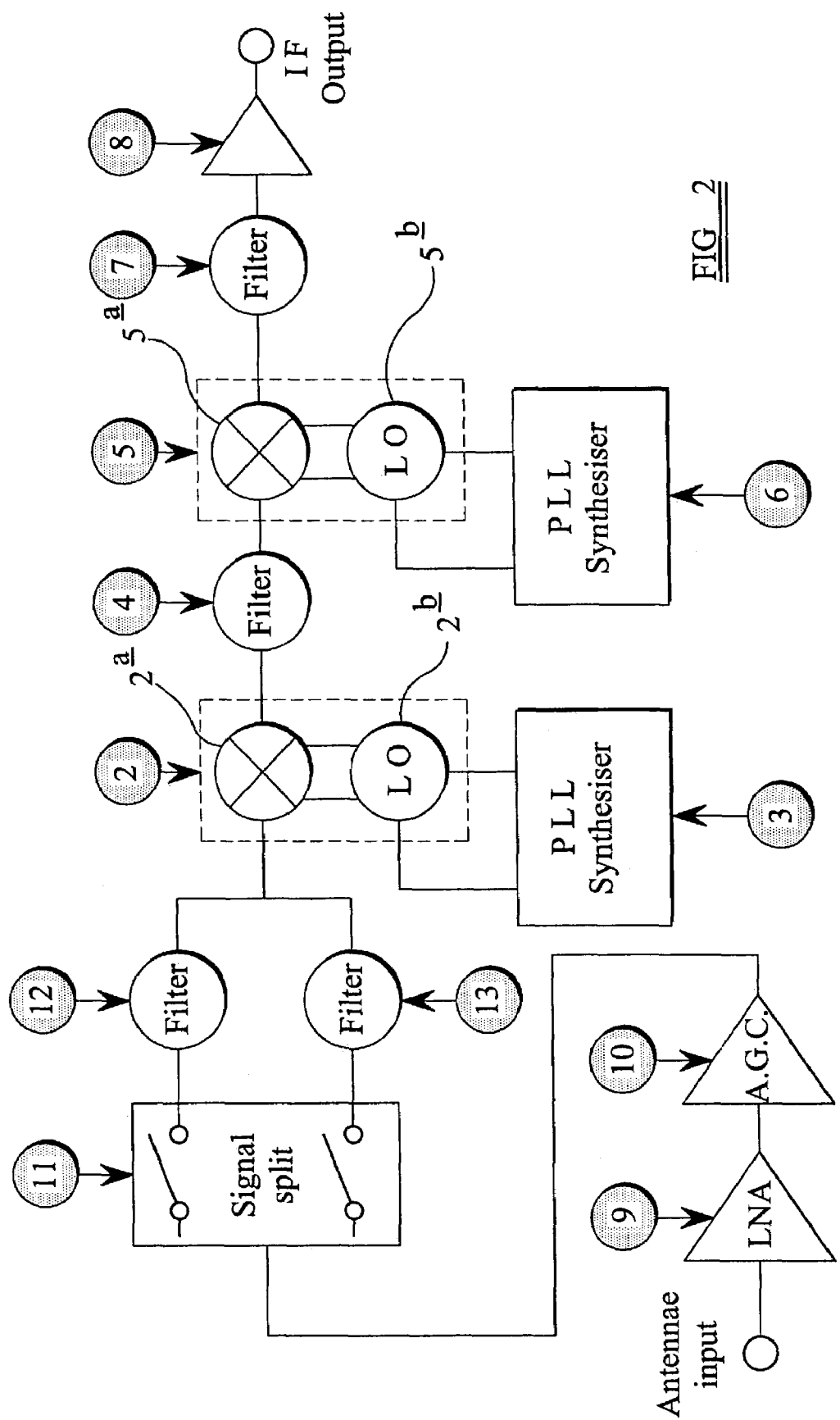
FIG. 2 is a block circuit diagram of a cable tuner and front end constituting an embodiment of the invention.

The tuner shown in FIG. 2 comprises first and second frequency changers 2, 5 and phase locked loops 3, 6, first and second intermediate frequency filters 4, 7 and an IF amplifier 8 which are the same as the corresponding stages shown in FIG. 1 and which will not, therefore, be described again. In addition, the tuner comprises a front end composed of stages 9 to 13.

The "antennae input" is connected to the input of a buffer stage in the form of a low noise amplifier (LNA) 9. The LNA 9 provides gain and has a good noise figure performance and signal handling performance. The output of the LNA 9 is connected to the input of an automatic gain control stage 10 which provides a variable gain, for example under control of a final baseband demodulator (not shown). The AGC stage 10 may be of active or passive type.

The output of the AGC stage 10 is connected to the input of an active signal splitter 11 which has a plurality of outputs (in this case two outputs). The outputs are individually disablable and are controlled such that only one output at a time is enabled in accordance with the frequency of the channel selected for reception. The LNA 9, the AGC stage 10 and the signal splitter 11 form a signal path which has a sufficiently wide bandwidth for passing all of the channels available for reception at the tuner input. The signal path also has a substantially constant voltage standing wave ratio over this bandwidth. The outputs of the signal splitter 11 are connected to two filtering paths which comprise bandpass filters 12 and 13. The filters 12 and 13 have passbands which are contiguous or which overlap slightly so as to divide the input band of signals received from a cable network into two sub-bands of substantially equal widths. For example, the input bandwidth of broadband signals from a typical cable network is from 50 to 860 MHz with channels spaced at 6 MHz intervals. The filter 12 has a passband from 50 to 455 MHz whereas the filter 13 has a passband from 455 to 860 MHz. Although the passbands are nominally contiguous, because the filters 12 and 13 have finite Qs, there is some passband overlapping. Also, although two filtering paths are shown, more such paths could be provided with the filters dividing the input band into more sub-bands.

In the case of two filtering paths as shown in FIG. 2, the filters 12 and 13 may be low pass and high pass filters, respectively, instead of bandpass filters. In the case of more than two filtering paths, low pass and high pass filters may be used in the filtering paths for the lowest and highest frequency filtering paths with bandpass filters being used in the or each other filtering path. The filtering paths divide the input band of the tuner into a plurality of sub-bands, each of which has upper and lower frequency limits (generally −3 dB points) with a ratio therebetween. The ratios of some or all of the sub-bands may be the same. When this ratio is substantially equal to two, each sub-band covers an octave with the upper limit frequency being substantially twice the lower limit frequency.

The outputs of the filters 12 and 13 are shown connected to the input of the mixer 2a of the first frequency changer 2. The synthesisers 3 and 6 are controlled, for example by an I$^2$C bus, so as to select any desired input channel for reception. If a channel in the lower half of the input band is selected, the output of the signal splitter 11 connected to the filter 12 is enabled whereas the output connected to the filter 13 is disabled. Conversely, if the selected channels lies in the upper half of the input band, the output to the filter 12 is disabled and the output to the filter 13 is enabled.

The front end comprising at least the stages 9 to 11 may be implemented as a single monolithic integrated circuit. This integrated circuit may comprise other parts of the tuner and, indeed, it is possible for the whole of the tuner to be implemented as a single monolithic integrated circuit. The filters 12 and 13 may be formed as part of the integrated circuit or may be implemented as discrete stages separate from the integrated circuit. Because the signal level or amplitude supplied to the filters 12 and 13 is limited by the AGC stage 10, the filters 12, 13 may, for example, be implemented as active filters, for example as gyrator type filters. Alternatively, these filters may be of passive LC type formed on the integrated circuit or implemented externally thereto.

Figure 3:
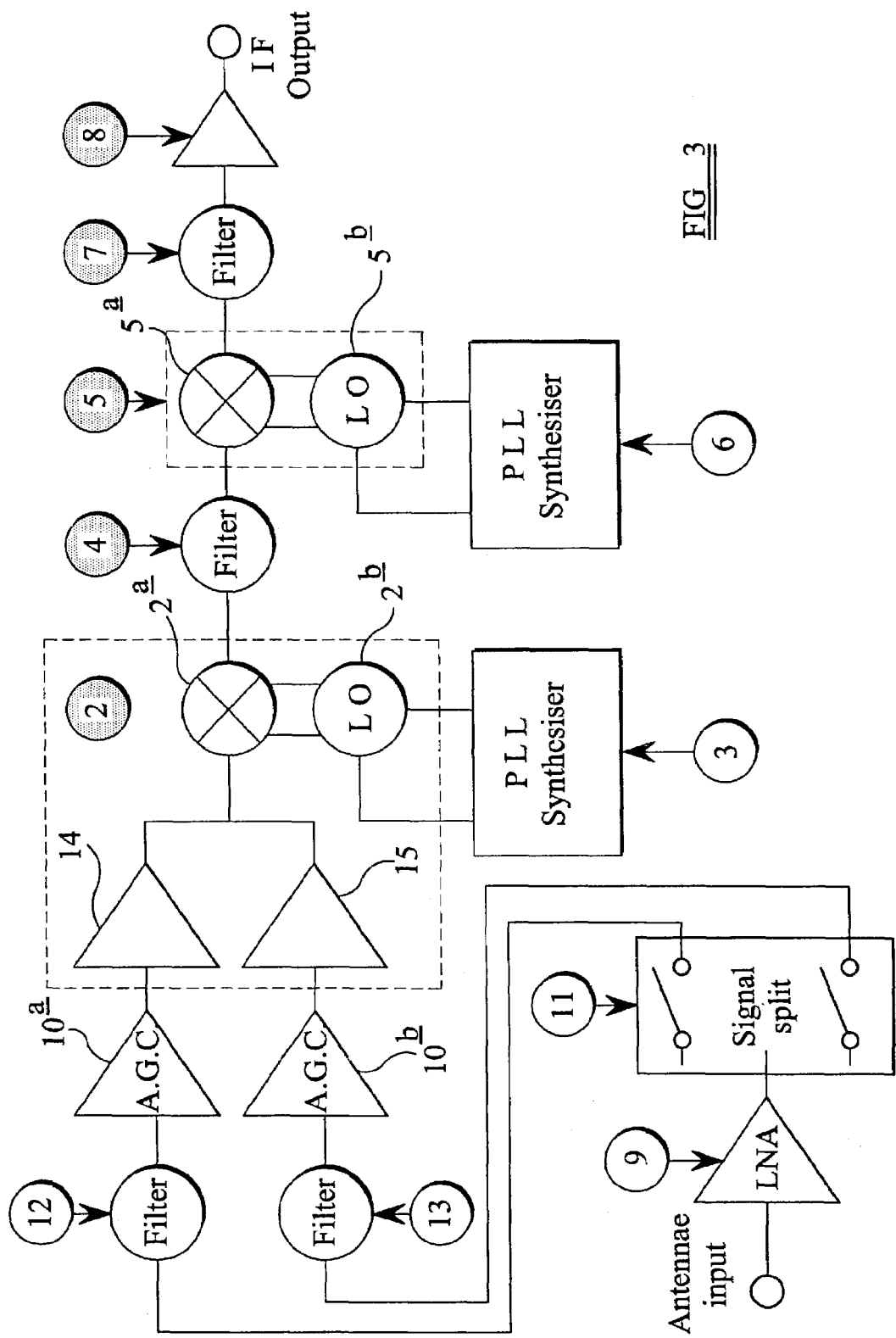
FIG. 3 is a block circuit diagram of another cable tuner and front end constituting another embodiment of the invention.

FIG. 3 shows a tuner and front end which differs from that shown in FIG. 2 in that the single AGC stage 10 ahead of the signal splitter 11 is replaced by individual AGC stages 10a and 10b in the filtering paths. These stages are shown after the filters 12, 13 in FIG. 3 but may alternatively be disposed in front of the filters or may even be included within the filters 12, 13. Also, the first frequency changer 2 comprises input stages 14 and 15 connected to the outputs of the AGC stages 10a and 10b, respectively. Each of the stages 14 and 15 is independently enablable such that the stage 14 is enabled and the stage 15 is disabled when the filtering path comprising the filter 12 is selected and the stage 15 is enabled and the stage 14 is disabled when the filter path comprising the filter 13 is selected. The stages 14 and 15 may be provided instead of or, as shown, in addition to the enable/disable capability of the signal splitter outputs.

In a further embodiment (not shown), the AGC stages 10a, 10b are replaced by a single AGC stage between the mixer 2a and the stages 14, 15.

The front end arrangements shown in FIGS. 2 and 3 allow signal degradation caused by intermodulation and thermal noise to be reduced while presenting a good impedance match to a cable distribution network to which the tuner is connected. Also, the presence of the LNA 9 improves the isolation of the tuner input from signals generated within the tuner. Thus, re-radiation through the network of spurious signals, for example from the local oscillators 2b and 5b, is substantially reduced so that other network users experience less interference. The filtering paths reduce the signal bandwidth supplied to the input of the first frequency changer 2 so that the total number of possible distortion beats is substantially reduced. For example, with an input band from 50 to 860 MHz containing channels with a spacing of 6 MHz, interference beats could occur in the highest frequency channel from intermodulation between pairs of channels, the sum of whose frequencies is 860 MHz. If the input band is divided at 455 MHz into two sub-bands as described hereinbefore, there are no pairs which can beat to give a frequency of 860 MHz. Although cross-modulation between channels is not completely eliminated by dividing the input band, the number of possible spurious products is substantially reduced. In the case of dividing the input band into two sub-bands, the number of possible interfering products is reduced by a factor of 2.

The presence of the LNA 9 buffers the noise contribution of the mixer 2a of the first frequency changer 2 so that an improved noise figure can be achieved. The compromises between conflicting performance requirements which are necessary in known tuners, for example of the type shown in FIG. 1, can thus be avoided or substantially reduced. In particular, compromises in the design of the first mixer 2a can be reduced because the noise figure and VSWR performance can be relaxed without comprising tuner performance to allow a desired intermodulation and P1 dB at reduced overall power consumption to be achieved.

The presence of the LNA 9 ahead of the AGC stage or stages makes it possible to maintain a good VSWR at all AGC gain settings. This avoids the disadvantage in the tuner of FIG. 1 whereby the tuner input impedance varies with the AGC setting. Similarly, the presence of the LNA 9 ahead of the filter stages 12 and 13 allows the VSWR to be substantially constant across the whole input band.

What is claimed is:

1. A radio frequency tuner front end, comprising:
an input for receiving an input signal in an input band containing a plurality of channels;
filtering paths arranged to receive said input signal and having fixed frequency responses for dividing said input band into a plurality of sub-bands, each of which contains a plurality of said channels;
a signal path between said input and said filtering paths having a bandwidth sufficiently wide to pass said input band and a substantially constant voltage standing wave ratio over said bandwidth; and
a selecting arrangement for enabling any one of said filtering paths at a time to supply a filtered signal to a first mixer, wherein a first of said filtering paths for a lowest of said sub-bands has a low pass filtering response, a second of said filtering paths for a highest of said sub-bands has a high pass filtering response, and at least one other of said filtering paths has a bandpass filtering response.

2. A front end as claimed in claim 1, in which ratios of an upper frequency limit to a lower frequency limit of said sub-bands are substantially equal to each other.

3. A front end as claimed in claim 2, in which said ratios are substantially equal to two.

4. A front end as claimed in claim 1, in which adjacent ones of said sub-bands are contiguous.

5. A front end as claimed in claim 1, in which adjacent ones of said sub-bands overlap.

6. A front end as claimed in claim 1, comprising two filtering paths.

7. A front end as claimed in claim 1, in which each of said filtering paths has a bandpass filtering response.

8. A front end as claimed in claim 6, in which said filtering paths comprise a lower path having a low pass filtering response and an upper path having a high pass filtering response.

9. A front end as claimed in claim 1, in which said signal path comprises a buffer stage.

10. A front end as claimed in claim 9, in which said buffer stage comprises a low noise amplifier.

11. A front end as claimed in claim 9, in which said signal path comprises an automatic gain control arrangement between said buffer stage and said filtering paths.

12. A front end as claimed in claim 1, further comprising a respective automatic gain control arrangement in each of said filtering paths.

13. A front end as claimed in claim 1, in which said signal path comprises a signal splitter having outputs for driving said filtering paths.

14. A front end as claimed in claim 13, in which said selecting arrangement is arranged to enable any one of said signal splitter outputs at a time.

15. A front end as claimed in claim 1, comprising a single monolithic integrated circuit.

16. A tuner comprising:
   a radio frequency tuner front end including:
      an input for receiving an input signal in an input band containing a plurality of channels;
      filtering paths arranged to receive said input signal and having fixed frequency responses for dividing said input band into a plurality of sub-bands, each of which contains a plurality of said channels;
      a signal path between said input and said filtering paths having a bandwidth sufficiently wide to pass said input band and a substantially constant voltage standing wave ratio over said bandwidth; and
      a selecting arrangement for enabling any one of said filtering paths at a time to supply a filtered signal to a first mixer, wherein in which a first of said filtering paths for a lowest of said sub-bands has a low pass filtering response, a second of said filtering paths for a highest of said sub-bands has a high pass filtering response, and at least one other of said filtering paths has a bandpass filtering response; and a first frequency changer.

17. A tuner as claimed in claim 16, in which said selecting arrangement comprises individually enable input stages of said first frequency changer having inputs connected to outputs of said filtering paths.

18. A tuner as claimed in claim 16, comprising a first intermediate frequency filter connected to an output of said first frequency changer.

19. A tuner as claimed in claim 16, in which said first frequency changer is an upconverter.

20. A tuner as claimed in claim 16, comprising a second frequency changer.

21. A tuner as claimed in claim 20, in which said second frequency changer is a downconverter.

22. A tuner as claimed in claim 20, comprising a second intermediate frequency filter connected to an output of said second frequency changer.

23. A tuner as claimed in claim 16, comprising a single monolithic integrated circuit.

24. A tuner as claimed in claim 16, comprising a cable tuner.

* * * * *